US012644928B2

(12) United States Patent
Mao et al.

(10) Patent No.: US 12,644,928 B2
(45) Date of Patent: Jun. 2, 2026

(54) MECHANICAL DEVICE FOR TESTING SHELL-LESS MOTOR

(71) Applicant: ZHEJIANG UNIVERSITY OF TECHNOLOGY, Zhejiang (CN)

(72) Inventors: Jianfeng Mao, Zhejiang (CN); Zhipeng Li, Zhejiang (CN); Li Li, Zhejiang (CN); Fujiong Zhao, Zhejiang (CN); Minglong Zhang, Zhejiang (CN); Binbin Chen, Zhejiang (CN); Chao Huang, Zhejiang (CN)

(73) Assignee: ZHEJIANG UNIVERSITY OF TECHNOLOGY, Zhejiang (CN)

( * ) Notice: Subject to any disclaimer, the term of this patent is extended or adjusted under 35 U.S.C. 154(b) by 170 days.

(21) Appl. No.: 18/811,691

(22) Filed: Aug. 21, 2024

(65) Prior Publication Data

US 2026/0056254 A1 Feb. 26, 2026

(51) Int. Cl.
G01R 31/34 (2020.01)

(52) U.S. Cl.
CPC .................................. G01R 31/343 (2013.01)

(58) Field of Classification Search
CPC .... G01R 31/343; G01M 15/00; G01M 15/02;
G01M 15/04; G01M 15/12; G01M
15/044; G01M 15/046; G01N 3/08; G01N
3/22; G01N 3/24; G01N 3/56; G01N
19/02; G01N 19/04; H01R 43/10
See application file for complete search history.

(56) References Cited

U.S. PATENT DOCUMENTS

| | | | | |
|---|---|---|---|---|
| 12,099,038 B1 * | 9/2024 | Zhao | ......................... | G01N 3/24 |
| 12,306,143 B1 * | 5/2025 | Wang | ......................... | G01N 3/56 |
| 2005/0016295 A1 * | 1/2005 | Kemnade | ............ | G01M 15/046 73/862.28 |
| 2019/0368974 A1 * | 12/2019 | Cariveau | ............... | F01C 1/0246 |

* cited by examiner

*Primary Examiner* — Thang X Le
(74) *Attorney, Agent, or Firm* — JCIPRNET

(57) ABSTRACT

A mechanical test device for testing shell-less motor includes a test bench, test motor, a test pedestal, a lift column, a lift platform upper plate, a lift platform lower plate, a stator fixture, a rotor fixture, bearings, a connecting shaft, a torque sensor, a magnetic powder brake, a lift device, and a shaft center-unified device. The test motor is fixed on a sliding guide rail by a rotor vertical adjustment device and a special fixture for a motor stator. The motor fixture uses a triangle structure to prevent the deviation of a central axis of a motor shaft. After the stator is fixed, the coaxial installation can be realized by adjusting the rotor vertical lift and adjusting device.

10 Claims, 5 Drawing Sheets

MECHANICAL DEVICE FOR TESTING SHELL-LESS MOTOR

BACKGROUND

Technical Field

The present disclosure belongs to the technical field of motor testing, in particular to a mechanical device for testing multi-type shell-less motors.

Description of Related Art

In the research and development of energy-efficient (or high-power density) motor, it needs to verify the voltage and current, electromagnetic torque, speed fluctuations and other electromagnetic performance under no-load, rated load, overload, etc. When designing and developing new types of motors, utilizing shell-less motors can greatly reduce the development cycle. However, the performance testing of shell-less motors requires a shell-less motor test device, so there is great room for development in this area.

When the size of the stator and rotor is changed, the shell of the motor is changed to some extent. Accordingly, the design cycle of the motor shell is long, and the cost on the custom-made machining is high.

It is difficult to test different types of motors without shell, and the extra custom-made parts are often required for motors with different sizes, which results in high test cost.

For traditional shell-less motor testing, it is difficult to comb the external complex wiring. Therefore, traditional shell-less motor testing has high security risks.

It is difficult to unify the axis of stator and rotor in shell-less motor. Moreover, it is difficult to measure and calibrate the separated stator and rotor by using the method of circular jump.

SUMMARY

The invention aims to provide a test stand for shell-less motor to solve the defects of the common motor test stand, such as the inability to be compatible with multiple motors, the lack of visual electromagnetic performance test, and lack of testing function for shell-less motors. More specially, it is difficult to unify the stator and rotor axis of shell-less motor.

In view of the above problems, the invention provides a mechanical device for shell-less motor testing, comprising a test bench and adjustable tooling fixtures, wherein the test device is arranged on the test bench. The test device mainly comprises a test pedestal and a lift mechanism, wherein the test pedestal is loaded with a stator fixture and a rotor fixture. Besides, the lift mechanism is mainly used for carrying a torque sensor and a magnetic powder brake. There are two sets of the motor fixture, which are distributed on both sides of the stator fixture. Each set includes the upper fixture, the lower fixture, and the lift platform. There are bearings installed between the rotor fixture and rotor.

As a further technical solution, the top surface of the test bench where places the test device using a stainless steel metal plate, that is provided with a T-shaped double-row through-hole for fixing the nut, wherein the middle of the double-row through-holes is provided with a slot of incoming-line which is communicated with the inner part of the bench.

As a further technical solution, T-shaped double-row chutes are arranged on both sides of the test pedestal, the middle of the T-shaped chutes is provided with a groove hole for arranging wire. In addition, the four corners of the test pedestal are provided with four threaded holes for fastening the lift column, and four threaded holes for penetrating the bench as T-shaped chutes. A positioning groove and eight threaded holes are arranged at the waist of the pedestal, and the threaded holes are respectively fastened by fastening screws and lower fixture of the stator.

As a further technical solution, the stator fixture comprises an upper fixture and a lower fixture, both of which come into contact with the stator in a triangular structure. The stator fixture is provided with four thread through-holes and positioning slots for fastening; the stator upper fixture is also provided with heat dissipation hole; and the lower fixture is provided with eight threaded holes, four holes of which are used to fasten the test pedestal, and the other four of which are through-holes for fastening thread.

As a further technical solution, the rotor fixture includes the upper fixture, the lower fixture and the lift table. The three parts of the rotor fixture are provided with threaded through-holes and positioning slots. The upper part of the rotor lift table has a square hole, while the lower part has a through-hole. Besides, the lower part has a lift screw, the front of which has three limit through-holes.

As a further technical solution, the test device mainly comprises a lift platform with upper and lower plate; the upper plate of lift platform is provided with sixteen threaded holes, four holes for fixing torque sensors, four holes for fastening magnetic powder brake, and six holes distributed around to fix the lift platform, another two are arranged under the torque sensor for damping. The lower plate of the lift platform is provided with ten threaded holes, two holes of which are corresponding to the above threaded holes for damping, four holes of which are used for fastening the test pedestal and the lift mechanism, and another four holes are used for fastening the lift platform and the lower plate.

As a further technical solution, center adjustment device has two parts for stator shaft and rotor shaft, one is a rotor chuck, and the other is a stator plug cone. The front of the rotor chuck is cut with a cross groove, meanwhile the inner wall is a bevel, and the rear exterior is provided with a screw hole; the front of the stator plug cone is a bevel, meanwhile the outer part of the stator plug cone is provided with a screw hole, and the rear inner wall is provided with a threaded hole.

The shell-less motor test stand provided by the invention has the following beneficial effects:

1) The different types of motor can be clamped by using the fixtures in this invention. The rotor and the test device can be continuously adjusted in all directions to adapt the stator shaft, thus realizing that test device can measure various types of motor. Consequently, the test cost is greatly saved. In addition, the practicability of the test device is greatly enhanced, while the test cycle of the shell-less motor is significantly shortened.

2) When testing the motor, the air-gap has a great influence on the motor efficiency, so it can be used to test the motor efficiency with various air-gap for different rotors within the same stator. It is not necessary to unify the stator and rotor shafts multiple times when the air-gap is changed. It can obtain accurate experimental data, shorten experimental time and improve experimental efficiency.

3) The test bench and the pedestal are provided with a wire-laying slot, through which the motor can be easily supplied with electricity without external wiring, so it is convenient to check the power supply lines, further-more the safety of electricity consumption is ensured with this simple test bench.

4) The axis unifying device provided can conveniently and effectively unify the axis of the stator and the rotor rapidly, comparing with the traditional method, the axis adjustment is faster in current device, as well as the accuracy is higher. Besides, the preparation time is shortened effectively for the proposed scheme herein.

DESCRIPTION OF THE EMBODIMENTS

The following technical scheme of the invention is clearly and completely described in combination with the attached drawings so as to facilitate the technical personnel in the technical field to understand the invention, not all embodiments. Pedestal on the embodiments of the invention, all other embodiments obtained by ordinary technicians in the field without performing creative work fall within the protection scope of the invention.

In the description of the invention, the azimuth or position relationship of the terms "Center", "Up", "Down", "Left", "Right", "Vertical", "Level", "Inside", "Outside", etc., should be pedestal on the location or position relationship shown in the attached drawings. These terms are used only to facilitate and simplify the description of the invention, and not to indicate or imply that the device or element referred to must have a specific orientation or be constructed and operated in a specific orientation. Therefore, it cannot be understood as limiting the invention.

The descriptive terms in the present invention, such as "Installation", "Connection", etc., shall be understood in a broad sense unless otherwise specified and qualified. For example, it can be a fixed connection, a detachable connection, or an integral connection; it can be a mechanical connection, or an electrical connection; it can be a direct connection, or it can be an indirect connection through an intermediary, it can also be a connection between two components. For the ordinary technical personnel in this field, the specific meaning of the above-mentioned terms in the present invention shall be understood according to the specific conditions.

Figure 1:
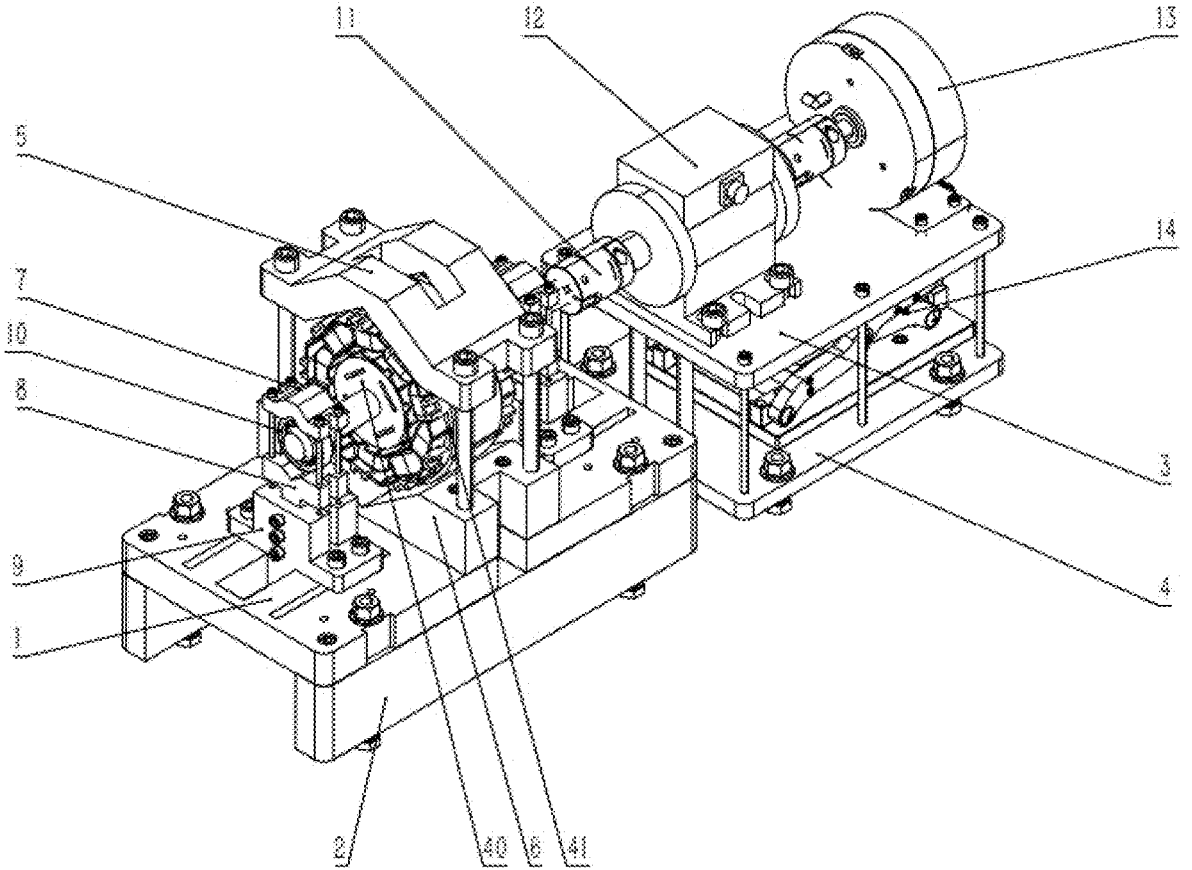
FIG. 1 is the integral structure diagram of the testing stand of the shell-less motor of the invention.

See FIG. 1, a mechanical stand for testing a shell-less motor, it includes test pedestal 1, lift column 2, lift platform upper plate 3, lift platform lower plate 4, stator upper fixture 5, stator lower fixture 6, rotor upper fixture 7, rotor lower fixture 8, rotor lift 9, bearing 10, shaft coupling 11, torque sensor 12, magnetic powder brake 13, lift 14, rotor chuck 42, stator cone 43.

Figure 2:
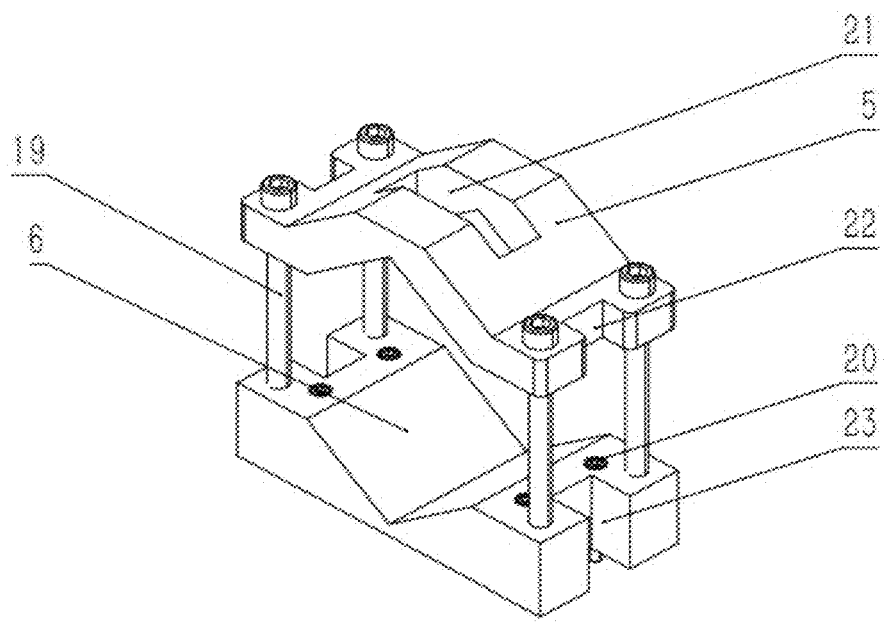
FIG. 2 is the stator fixture diagram of the testing stand of the shell-less motor of the invention.

See FIG. 2 for a better implementation, the stator fixture is placed in the middle of the test pedestal 1, and two sets of rotor fixtures are placed on both sides of the stator fixture, and connected to the motor rotor 40 through a bearing 10. The motor stator 41 is arranged on the triangular groove of the stator lower fixture 6, and the stator upper fixture 7 is arranged on the motor stator 41. The upper and lower fixtures of the stator are provided with four fastening through threaded holes and positioning grooves, and the stator fixture is preliminarily fixed with the test pedestal 1 through the stator fastening screw 19. It should be noted that the stator fastening screw 19 passes through the through-hole screw hole of the 27-hole stator from the upper stator fixture 5. The stator upper fixture 5 is provided with a stator cooling hole 21, through which the surface temperature of the stator can be detected, and the stator lower fixture is connected with the test pedestal 1 by fastening screw of stator lower fixture 20 corresponding to the fastening threaded hole of stator lower fixture 28. Accurate fixation of the stator can be realized by locating the positioning groove of stator upper fixture 22, the positioning groove of stator lower fixture 23 and positioning slot of the pedestals 26 to ensure the correct connection of the stator fixture.

Figure 3:
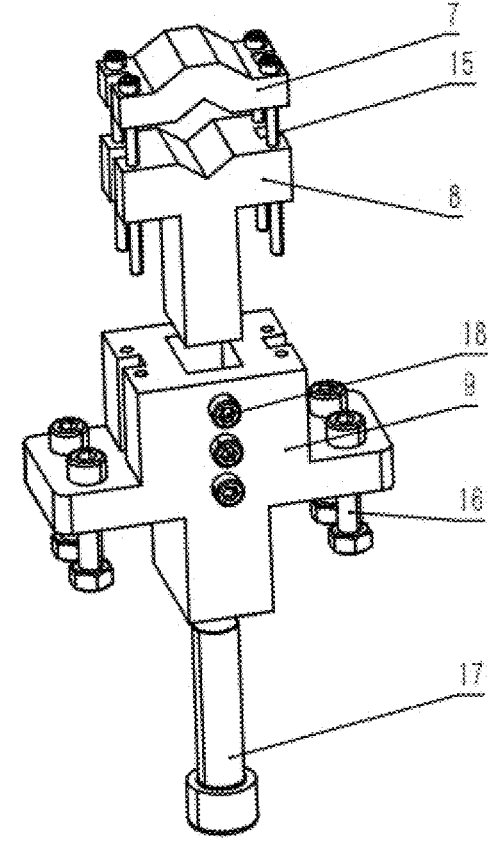
FIG. 3 is the rotor fixture diagram of the testing stand of the shell-less motor of the invention.

See FIG. 3 for a better implementation, the rotor fixture is divided into three parts: the rotor upper fixture 7, the rotor lower fixture 8 and the rotor lift 9, the three parts of the rotor fixture are all provided with thread through-holes and positioning grooves, the rotor fastening screw 15 is used to fix the rotor fixture, and the positioning groove is used to ensure the correct connection of the three. The rotor lift 9 is connected with the test pedestal 1 through rotor lift fastening screw 16 with a hexagonal screw head matched with the pedestal T-groove 29, which passes through the pedestal T-groove 29, the lower fixture 8 height of the rotor is determined at the bottom of the rotor lift 9 through the rotor lift screw 17, and then the rotor lower fixture 8 is further fixed by the limit screw 18 to reduce chattering, the upper end of the rotor lift 9 passes through the lower end of the rotor lower fixture 8.

Figure 4:
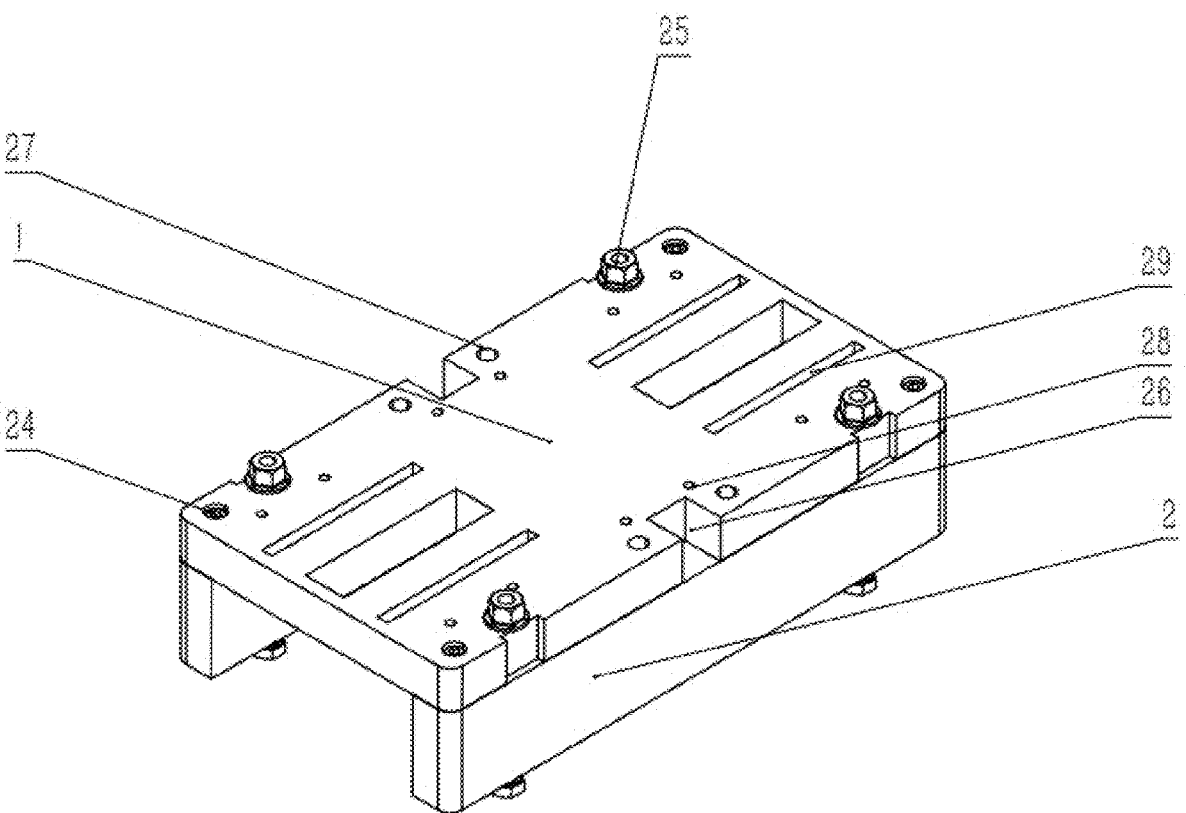
FIG. 4 is the bottom plate diagram of the stator and rotor fixture of the shell-less motor test stand of the invention.

See FIG. 4 for a better implementation. The lift column 2 holds the test pedestal, the lift column, and the bench by through-hole screw 25, and the through-screw head is a hexagonal type matching the T-groove 36, the test pedestal 1 is connected with the lift column 2 by reinforcing the thread slot holes of fastening screw of the pedestal plate 24 in the four corners of the test pedestal 1.

Figure 5:
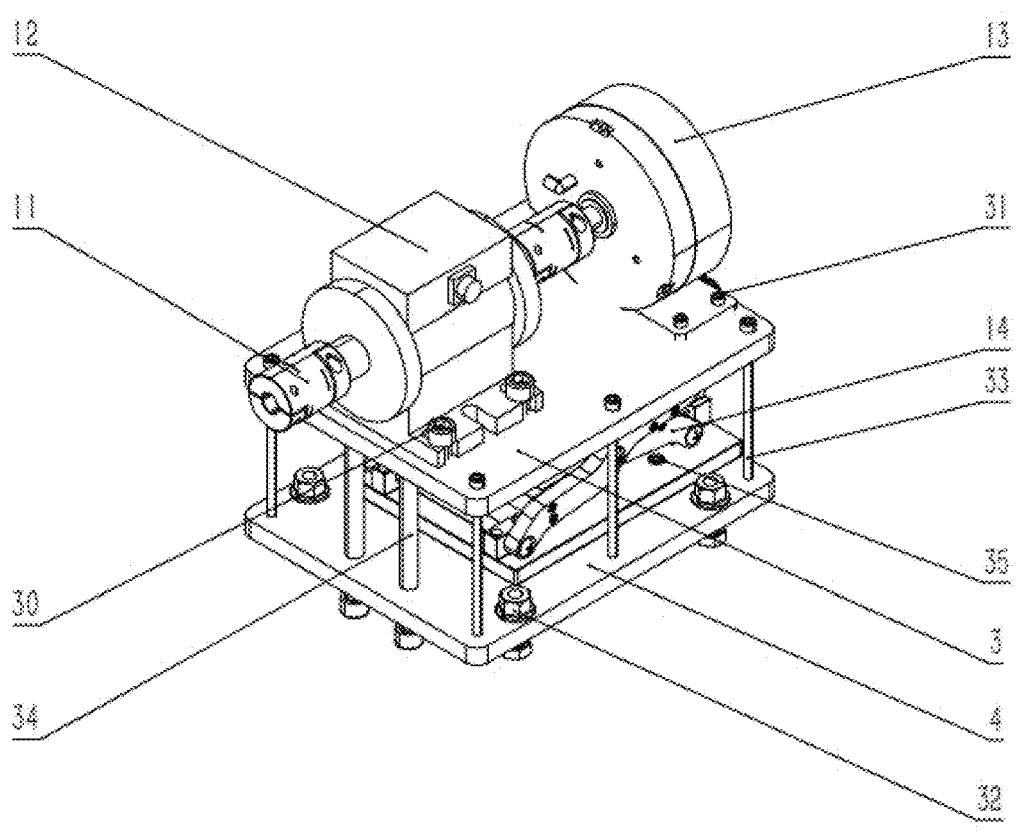
FIG. 5 is the lift mechanism of the torque sensor and the magnetic powder brake of the shell-less motor test stand of the invention.

See FIG. 5 for a preferred embodiment, where the motor rotor 40 is connected with the torque sensor 12 and the torque sensor 12 is connected with the magnetic powder brake 13 through a shaft coupling 11. The torque sensor 12 is connected with the lift platform upper plate 3 by the fixed screw of torque sensor 30, and the magnetic powder brake 13 is connected with the lift platform upper plate 3 by the fixed screw of magnetic powder brake 31. The lift 14 is connected with the pedestal through the lower plate screw 35, and the lift platform lower plate 4 is connected with the test pedestal 1 through the lift table plate fastening screw 32. After the height of the lift platform is determined, the height of the lift platform is fixed by fixed screw of lift table 33, and the connection with the test pedestal 1 is strengthened by lift table shock absorber screw 34 through the shock absorption perforation 37, which can effectively reduce the lift platform buffeting.

Figure 6:
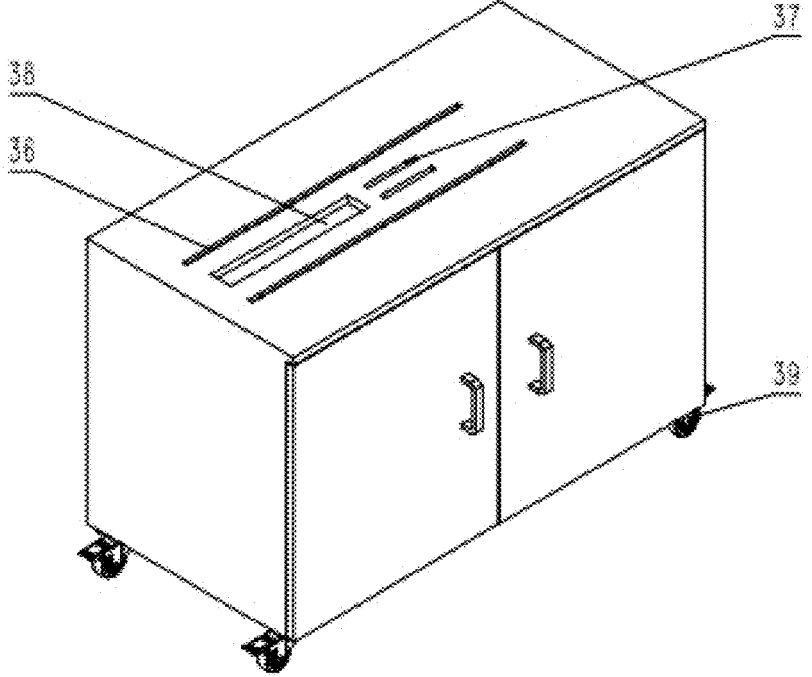
FIG. 6 is a movable test stand for the testing stand of the shell-less motor of the invention.

See FIG. 6 for a better implementation, the top of the test bench with the test device part using stainless steel metal sheet, the stainless steel metal plate is provided with T-grooves 36 for placing the fastening nut used for fixing the test device, and cube perforation 38 is arranged in the middle front of the two rows of T-shaped grooves for wiring the power supply line of the motor, the power supply equipment is placed on the upper floor of the two-tier bench, and it can be distributed from the inside through the cube perforation 38, and the rear of the middle of the T-shaped slot is provided with the shock absorption perforation 37 through the lift table lower plate fasting screw 34.

Figure 7:
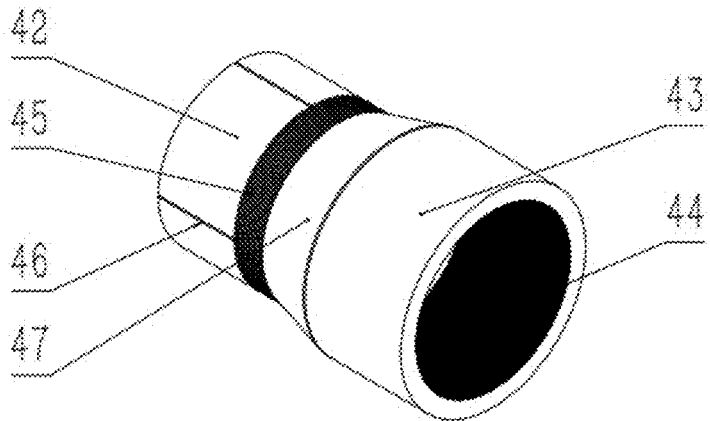
FIG. 7 is the stator and rotor shaft unified device of the shell-less motor test stand of the invention.

See FIG. 7 for a better implementation, center adjustment device for stator shaft and rotor shaft is divided into two parts, one is a rotor chuck 42 to clamp the stator, the other is the stator cone 43 through the motor air-gap against the stator. In order to increase the flexibility of the chuck, the front section of the rotor chuck 42 is cut to form slot hole of rotor chuck 46, and the front inner wall shrinks inward to ensure that a certain fixture range is fixed on the outer warp of the rotor, so that the rotor chuck 42 is unified with the axis of the motor rotor 40. The outer diameter of the back half is connected with the screw hole of stator cone 44. The stator cone 43 is united with the axis of the rotor chuck 42 through the screw hole of stator cone 44. The axis of the stator and the rotor can be unified by installing the bevel of stator top cone 47 on the motor stator 41.

Figure 8:
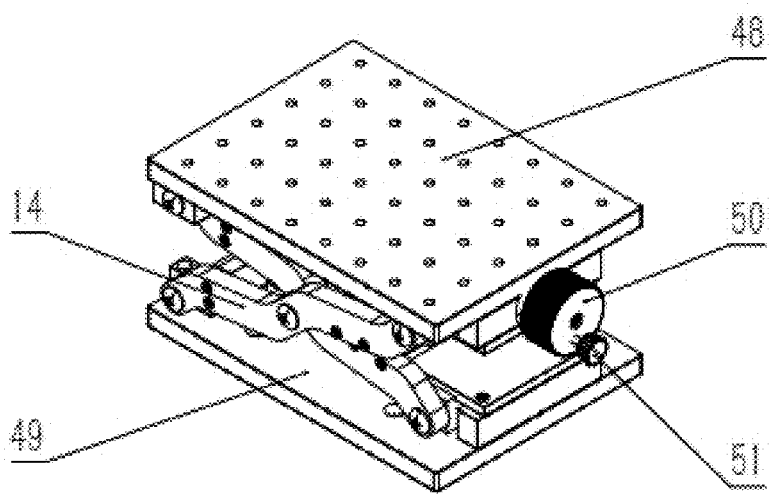
FIG. 8 is the lift of the shell-less motor test stand of the invention.

See FIG. 8 for a better implementation, lift 14 is secured to lift platform upper plate 3 through a threaded hole in lift upper table 48. The height of the lift platform is preliminarily determined by coarse knob 50, while the height of the motor rotor 40 is determined by using the center adjustment device. When the motor rotor 40 is fixed, the height of the lift platform is accurately adjusted through the fine-tuning knob 51, so that the torque sensor 12 and the magnetic powder brake 13 are unified with the motor shaft.

The above description is only a better embodiment of the invention, which does not therefore limit the implementation method and the protection scope of the invention. It shall be understood that the scheme resulting from equivalent substitutions and obvious changes made using the description and illustration of the invention shall be covered by the protection of the invention.

What is claimed is:

1. A mechanical test stand for a shell-less motor, comprising a test bench and a test device arranged on the test bench, wherein the test device comprises a test motor, a test pedestal, a lift column, a lift platform upper plate, a lift platform lower plate, a stator fixture, a rotor fixture, bearings, a connecting shaft, a torque sensor, a magnetic powder brake, a lift device and a shaft center-unified device; the test device is arranged on a sliding guide rail of the test bench, a motor stator is arranged on the stator fixture, and the rotor fixture is arranged on both sides of the stator fixture according to height adjustment of a motor shaft axis, the test device is able to be adaptively adjusted with a height according to a position of the motor shaft axis on a lift platform, as a layout form of the test bench, the test motor is connected with the torque sensor through an elastic coupling, meanwhile the magnetic powder brake is connected with the torque sensor through an elastic coupling.

2. The mechanical test stand for a shell-less motor according to claim 1, wherein a top surface of the test stand is provided with a stainless steel metal plate, which is provided with a double-row T-shaped chute for clamping the test device, a cube slot is arranged for supplying power to the test motor, and the test device is arranged on the test bench.

3. The mechanical test stand for a shell-less motor according to claim 2, wherein the sliding guide rail and the test device are fixed by hexagonal screw, and the hexagonal screw is clamped on the double-row T-shaped chute of the stainless steel metal plate.

4. The mechanical test stand for a shell-less motor according to claim 1, wherein the stator fixture is configured for clamping the motor stator, the stator fixture comprises a stator upper fixture and a stator lower fixture, the stator fixture is provided with four fastening through threaded holes and positioning slots, the stator fixture is clamped and connected with the test pedestal by fastening the thread through-holes and positioning slots, the stator lower fixture is provided with eight threaded holes, four holes of which fasten the test pedestal and the stator lower fixture of the stator fixture, and the other four of which fasten the thread through-holes.

5. The mechanical test stand for a shell-less motor according to claim 1, wherein the rotor fixture comprises a rotor upper fixture, a rotor lower fixture and a rotor lift table, the rotor upper fixture, the rotor lower fixture and the rotor lift table are all provided with thread through-holes and positioning grooves, which are configured to clamp the bearings by fastening the thread through-holes and the positioning grooves.

6. The mechanical test stand for a shell-less motor according to claim 5, wherein the rotor lift table is connected with the test pedestal and the rotor fixture, the rotor lift table has a vertical middle upper half forming a square hole and a lower half forming a threaded hole, the square hole passes through the stator lower fixture, and a bearing height is adjusted with the threaded hole of the rotor lift table through rotor lift screws, and a front of the rotor lift table is provided with three limit threaded holes to clamp the rotor lower fixture.

7. The mechanical test stand for a shell-less motor according to claim 1, wherein the test device comprises the lift platform, the lift platform upper plate, and the lift platform lower plate; the lift platform upper plate and the lift platform lower plate are fixed with the lift device through screw holes, the torque sensor and the magnetic powder brake are fixed on the lift platform upper plate, and the lift platform lower plate is fixed on the test bench.

8. The mechanical test stand for a shell-less motor according to claim 7, wherein an approximate height of the lift platform is first determined with a coarse adjusting knob, and then the motor shaft axis is unified with a fine adjusting knob, and a height of the lift platform is fixed by a nut.

9. The mechanical test stand for a shell-less motor according to claim 1, wherein the shaft center-unified device has two parts, one is a rotor chuck, and the other one is a stator top cone; a front of the rotor chuck is cut with a cross groove to clamp a rotor, an inner wall of the rotor chuck is an inclined plane, and a rear outer part of the rotor chuck is provided with a threaded hole; a front outside of the stator top cone are inclined planes to hold the motor stator, and a back inner wall of the stator top cone is provided with a threaded hole to be connected with the rotor chuck.

10. The mechanical test stand for a shell-less motor according to claim 9, wherein the rotor chuck is clamped to the rotor, the stator top cone is connected to the rotor chuck with the threaded hole, and the stator top cone rests against the motor stator so that the axis of the motor stator and the rotor is in a same line.

\* \* \* \* \*